United States Patent

Morishima

[11] Patent Number: 6,046,611
[45] Date of Patent: Apr. 4, 2000

[54] SEMICONDUCTOR CIRCUIT DEVICE WITH RECEIVER CIRCUIT

[75] Inventor: Chikayoshi Morishima, Tokyo, Japan

[73] Assignee: Mitsubishi Denki Kabushiki Kaisha, Tokyo, Japan

[21] Appl. No.: 09/089,452

[22] Filed: Jun. 3, 1998

[30] Foreign Application Priority Data

Jan. 26, 1998 [JP] Japan .................................. 10-012744

[51] Int. Cl.[7] .................................................. H03K 5/153
[52] U.S. Cl. .............................................. 327/72; 327/266
[58] Field of Search .............................. 327/72, 73, 261, 327/263, 266, 274, 280, 287

[56] References Cited

U.S. PATENT DOCUMENTS

| | | | |
|---|---|---|---|
| 4,677,388 | 6/1987 | Morrison | 327/72 |
| 4,803,701 | 2/1989 | Rhodes | 327/266 |
| 4,821,292 | 4/1989 | Childress | 327/73 |
| 5,274,273 | 12/1993 | Baginski et al. | 327/72 |
| 5,726,742 | 3/1998 | Nourrcier | 327/72 |

FOREIGN PATENT DOCUMENTS

| | | |
|---|---|---|
| 4-263514 | 9/1992 | Japan . |
| 9-161484 | 6/1997 | Japan . |
| 63-246925 | 10/1998 | Japan . |

*Primary Examiner*—Toan Tran
*Attorney, Agent, or Firm*—Burns, Doane, Swecker & Mathis, LLP

[57] ABSTRACT

A delay circuit (7) delays a transfer signal (V1) transferred through a transfer signal line (1) by the first delay time (dt1) to generate the first delayed signal (V9) and delays the first delayed signal (V9) by the second delay time (dt2) to generate the second delayed signal (V10). The second current mirror differential amplifier circuit (11) receives the transfer signal (1) and the second delayed signal (V10), whose ground terminal is connected to the first delayed signal line (9). On the other hand, the first current mirror differential amplifier circuit (14) also receives the transfer signal (V1) and the second delayed signal (V10), whose power-supply terminal is connected to the first delayed signal line (9). In response to a rise of the input signal (V1), the circuit (14) starts its operation to change a level of an output signal (V6) from "L" level to "H" level, remaining thereafter. After that, in response to a fall of the input signal (V1), the circuit (11) starts its operation to change the level of the output signal (V6) from "H" level to "L" level. With this configuration, a receiver circuit of a semiconductor circuit device achieves a faster operation and a lower power consumption.

9 Claims, 4 Drawing Sheets

SEMICONDUCTOR CIRCUIT DEVICE WITH RECEIVER CIRCUIT

BACKGROUND OF THE INVENTION

1. Field of the Invention

The present invention relates to a semiconductor circuit device comprising a receiver circuit, and more particularly to a higher-speed operation and a lower power consumption of the circuit.

2. Description of the Background Art

FIG. 4 shows a basic configuration of a semiconductor device in the prior art.

In FIG. 4, a driving circuit 3P for generating a transfer signal includes an inverter circuit 4P. An input terminal of the driving circuit 3P is connected to a signal line for transferring an output signal from an ante-stage circuit and an output terminal thereof is connected to one end of a transfer signal line 1P for transferring the transfer signal. Further, the other end of the transfer signal line 1P is connected to an input terminal of a receiver circuit 5P.

The receiver circuit 5P includes an inverter circuit 100 and an output terminal thereof is connected to an output signal line 6P for transferring an output signal from the receiver circuit 5P to a subsequent-stage circuit.

Furthermore, capacitances such as wiring parasitic capacitance applied to the transfer signal line 1P, which exist between a potential of the transfer signal line 1P and a ground potential, are represented by 2P conceptually as a single capacitance in FIG. 4.

Now, an operation of the prior-art semiconductor circuit device of FIG. 4 will be studied below.

With high integration of the semiconductor circuit device, in recent, times the number of circuits in the semiconductor circuit device dramatically increases, and at the same time the lengths of signal lines for connecting these circuits have increased. Thus, (i) when many circuits are connected to a signal line or (ii) when a signal line is very long, a value of the capacitance 2P of FIG. 4, which includes gate capacitance and diffusion capacitance of circuits and parasitic capacitance between the potential of the signal line and the ground potential, becomes very large. In this case, with an increase of the value of the capacitance 2P, a rise time for changing a potential of the transfer signal inputted to the receiver circuit 5P from the ground potential to the power-supply potential or a fall time for changing a potential of the transfer signal from the power-supply potential to the ground potential becomes very long.

In the prior-art receiver circuit 5P, however, the output signal from the inverter circuit 100 is not outputted until the potential of the transfer signal changes to at least half of the power-supply potential since the inverter circuit 100 consists of a P-type MOS transistor and an N-type MOS transistor which are ordinarily so designed as to have almost the same driving power. Therefore, a delay time of the output signal from the receiver circuit 5P becomes still larger due to still longer rise and fall times of the transfer signal inputted to the inverter circuit 100 with an increase of the value of the capacitance 2P.

Though it is necessary to suppress an increase of the rise or fall time in order to solve the above problems, it seems difficult to take radical measures in terms of configuration of the present semiconductor circuit device.

On the one hand, as one of solutions of these problems, it is conceivable to increase the driving power of the driving circuit 3P of FIG. 4, specifically, to increase the transistor size of the inverter circuit 4P. This solution allows a decrease of the delay time of the transfer signal, but arises a new problem of higher power consumption of the driving circuit 3P.

On the other hand, a technique for higher speed operation of the receiver circuit is proposed in Japanese Patent Application Laid Open Gazette 9-161484. In this prior art, a current mirror differential amplifier circuit serving only for the rise of the transfer signal and another current mirror differential amplifier circuit serving only for the fall of the transfer signal are separately provided and outputs of these circuits are selectively outputted.

The current mirror differential amplifier circuit serving only for the rise and that only for the fall proposed in the prior art, however, receive the transfer signal and a reference voltage signal as input signals, and the reference voltage signal is set to a constant level. For example, if the reference voltage signal is set to achieve a higher speed operation on the rise of the transfer signal, it is impossible to achieve a high-speed operation on the fall. Conversely, if the reference voltage signal is set to achieve a higher speed operation on the fall of the input signal, it interferes with a high-speed operation on the rise. Therefore, in this document, to ensure a sufficient operation speed on both the rise and fall of the transfer signal, a value of the reference voltage signal is set to a voltage value intermediate between the high-potential power supply and low-potential power supply. In short, the prior art performs substantially the same operation as the receiver circuit 5P of FIG. 4, and it has to be admitted that the prior art can not work as an effective solution of the above problem.

Further, it is impossible, in the circuits proposed in the prior art, to achieve a lower power consumption since also in a stationary state after the rise or fall of the transfer signal, a DC current flows in a path consisting of a MOS transistor receiving the reference signal, another MOS transistor which is a constituent of a current mirror and connected to the MOS transistor and still another MOS transistor serving as a constant-current power supply.

One of solutions of the above problem is proposed in Japanese Patent Application Laid Open Gazette 63-246925. The prior art reduces both the rise and fall delay times by setting different input threshold voltages for the rise time and the fall time of the transfer signal in a CMOS inverter, to achieve a higher speed operation of the inverter circuit.

With a detailed study on an operation of the inverter circuit in the prior art, however, it is found that a pass current flows across the high-potential power supply and the ground potential since a PMOS transistor whose gate electrode is connected to the transfer signal and source electrode is connected to the high-potential power supply is in an on state at some point near a level which exceeds the input threshold voltage of the circuit in a change of the transfer signal from "L" level to "H" level. The pass current blocks a change of an output signal to "L" level, and therefore a sufficiently high-speed operation, as compared with a conventional inverter circuit, is not achieved in the circuit of the prior art.

SUMMARY OF THE INVENTION

The present invention is directed to a semiconductor circuit device. According to a first aspect of the present invention, the semiconductor circuit device, comprises: a driving circuit generating a first signal; a first signal line transferring the first signal; a delay circuit connected to the first signal line, the delay circuit delaying the first signal by a predetermined time to output a second signal; a second signal line transferring the second signal; and a differential amplifier circuit connected to the first and second signal lines as input signal lines, wherein the predetermined time is longer than a time needed for a level change of the first signal from a low power-supply potential to a higher potential by a first threshold voltage, the first threshold voltage is lower than an intermediate potential between the low power-supply potential and a high power-supply potential, the differential amplifier circuit outputs an output signal of the low power-supply potential when both the first and second signals are of the low power-supply potential, the differential amplifier circuit changes a level of the output signal from the low power-supply potential to the high power-supply potential when the first signal rises from the low power-supply potential by the first threshold voltage to reach the higher potential, and the differential amplifier circuit continues outputting the output signal of the high power-supply potential when both the first and second signals are of the high power-supply potential.

According to a second aspect of the present invention, in the semiconductor circuit device of the first aspect, the predetermined time is longer than a time needed for a level change of the first signal from the high power-supply potential to a lower potential by a second threshold voltage, the second threshold voltage is lower than the intermediate potential, and the differential amplifier circuit changes the level of the output signal from the high power-supply potential to the low power-supply potential when the first signal falls from the high power-supply potential by the second threshold voltage.

According to a third aspect of the present invention, in the semiconductor circuit device of the first aspect, a level change of the second signal is completed when the level change of the first signal is completed or later.

According to a fourth aspect of the present invention, in the semiconductor circuit device of the first aspect, the differential amplifier circuit produces no DC current when both the first and second signals are of the high power-supply potential or the low power-supply potential.

According to a fifth aspect of the present invention, in the semiconductor circuit device of the fourth aspect, the delay circuit comprises a first delay circuit delaying the first signal by a first delay time to output a first delayed signal; and a second delay circuit delaying the first delayed signal by a second delay time to output a second delayed signal, the predetermined time is a sum of the first delay time and the second delay time, the differential amplifier circuit comprises a first current mirror differential amplifier circuit, which receives the first signal and the second delayed signal, having a low-potential terminal which is connected to a low-potential power supply of the low power-supply potential and a high-potential terminal which receives the first delayed signal; and a second current mirror differential amplifier circuit which receives the first signal and the second delayed signal, having a high-potential terminal which is connected to a high-potential power supply of the high power-supply potential and a low-potential terminal which receives the first delayed signal, the differential amplifier circuit outputs the output signal which rises from the low power-supply potential to the high power-supply potential in response to a level change of an output signal from the first current mirror differential amplifier circuit, and the differential amplifier circuit outputs the output signal which falls from the high power-supply potential to the low power-supply potential in response to a level change of an output signal from the second current mirror differential amplifier circuit.

According to a sixth aspect of the present invention, in the semiconductor circuit device of the fifth aspect, the delay circuit comprises a plurality of inverter circuits connected in series to one another.

The present invention is also directed to a receiver circuit. According to a seventh aspect of the present invention, the receiver circuit comprises: a differential amplifier circuit having input terminals each receiving a transfer signal transferred through an interconnection and a delayed signal of the transfer signal.

According to an eighth aspect of the present invention, in the receiver circuit of the seventh aspect, the delayed signal comprises a first delayed signal produced by delaying the transfer signal by a first delay time; and a second delayed signal produced by delaying the transfer signal by a second delay time larger than the first delay time, the differential amplifier circuit comprises a first current mirror differential amplifier circuit having a low-potential terminal which is connected to a low-potential power supply and a high-potential terminal which receives the first delayed signal, the first current mirror differential circuit receiving the transfer signal and the second delayed signal; and a second current mirror differential amplifier circuit having a high-potential terminal which is connected to a high-potential power supply and a low-potential terminal which receives the first delayed signal, the second current mirror differential amplifier circuit receiving the transfer signal and the second delayed signal, the differential amplifier circuit outputs the output signal which rises from a low power-supply potential to a high power-supply potential in response to a level change of an output signal from the first current mirror differential amplifier circuit, and the differential amplifier circuit outputs the output signal which falls from the high power-supply potential to the low power-supply potential in response to a level change of an output signal from the second current mirror differential amplifier circuit.

According to a ninth aspect of the present invention, a receiver circuit comprises: a delay circuit having an input terminal receiving a first signal and a first output terminal outputting a delayed signal of the first signal as a second signal; and a differential amplifier circuit connected to the input terminal and the first output terminal, the differential amplifier circuit comprising a second output terminal, the second output terminal outputting an output signal of low power-supply potential when both the first and second signals are of the low power-supply potential, the second output terminal outputting an output signal of high power-supply potential when both the first and second signals are of the high power-supply potential, the second output terminal outputting an output signal of the high power-supply potential when the first signal is higher in potential than the second signal, and the second output terminal outputting an output signal of the low power-supply potential when the first signal is lower in potential than the second signal.

(1) In the semiconductor circuit device of the first aspect, since the second signal is behind the first signal by the predetermined time, the second signal remains at the low power-supply potential even when the first signal changes from the low power-supply potential to the higher potential by the first threshold voltage. Therefore, the differential amplifier circuit receiving the first and second signals can output the output signal of high power-supply potential when the first signal reaches the first threshold voltage before the first signal rises from the low power-supply potential to the intermediate potential. The semiconductor circuit device of the first aspect thereby produces an effect of generating the output signal which changes from the low power-supply potential to the high power-supply potential at higher speed than the prior-art semiconductor circuit device. The semiconductor circuit device of the first aspect produces another effect of avoiding malfunction of the differential amplifier circuit even if the first and second signals have a noise smaller than the first threshold voltage. Thus, the device of the first aspect has higher noise immunity, being capable of performing a still faster operation than the prior-art semiconductor circuit device.

Moreover, since the differential amplifier circuit outputs the output signal in quick response to the rise of the transfer signal, the device of the first aspect eliminates the necessity to increase a driving power of the driving circuit as compared with that of the prior-art driving circuit in order to achieve a faster operation of the semiconductor circuit device and therefore the conventional driving circuit can be used without any improvement. Still more, it is possible to decrease the driving power of the driving circuit as compared with that of the prior-art driving circuit. In this point, the semiconductor circuit device of the first aspect can achieve a lower power consumption as compared with the prior-art semiconductor circuit device.

(2) In the semiconductor circuit device of the second aspect, for the same reason as (1), the differential amplifier circuit can immediately change the level of the output signal from the high power-supply potential to the low power-supply potential when the first signal reaches the potential lower than the high power-supply potential by the second threshold voltage before the first signal reaches the intermediate potential on its fall from the high power-supply potential to the low power-supply potential. Therefore, in quick response to the level change of the transfer signal also on its fall before the transfer signal reaches the intermediate potential, the device of the second aspect can fall the output signal faster than the prior-art device. Also in this case, the driving circuit which generates the transfer signal is not required to increase its driving power and therefore the device of the second aspect achieves a much lower power consumption.

(3) In the semiconductor circuit device of the third aspect, since the level change of the second signal is completed when the level change of the first signal is completed or later, the level of the first signal is always higher than that of the second signal on its rise and conversely the level of the first signal is always lower than that of the second signal on its fall. Therefore, the device of the third aspect has an advantage that the output signal of the differential amplifier circuit is not inverted during the level change of the first signal. Thus, the device of the third aspect ensures the effect of the first aspect.

(4) The semiconductor circuit device of the fourth aspect achieves a lower power consumption also inside the differential amplifier circuit since the differential amplifier circuit produces no DC current when the first and second signals are in a stationary state.

(5) The semiconductor circuit device of the fifth aspect produces the same effect as (1) and (4). The semiconductor circuit device of the fifth aspect can be applied to various uses for general purpose, particularly, since it achieves a faster rise of the output signal by the first differential amplifier circuit in response to the rise of the first signal and on the other hand achieves a faster fall of the output signal by the second differential amplifier circuit in response to the fall of the first signal.

(6) In the semiconductor circuit device of the sixth aspect, since the delay circuit comprises a plurality of inverter circuits connected in series to one another, it is possible to easily control the first and second delay times. That allows flexible designs for various kinds of semiconductor circuit devices.

(7) The receiver circuit of the seventh aspect produces the same effect as (1) and (2).

(8) The receiver circuit of the eighth and ninth aspects produces the same effect as (1) to (5).

An object of the present invention is to provide a semiconductor circuit device and a receiver circuit capable of reducing a delays time of an output signal in response to a change of a transfer signal as much as possible for a still faster operation.

Another object of the present invention is to provide a semiconductor circuit device and a receiver circuit capable of achieving a lower power consumption, while achieving the above object, as compared with a conventional semiconductor circuit device and a conventional receiver circuit These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
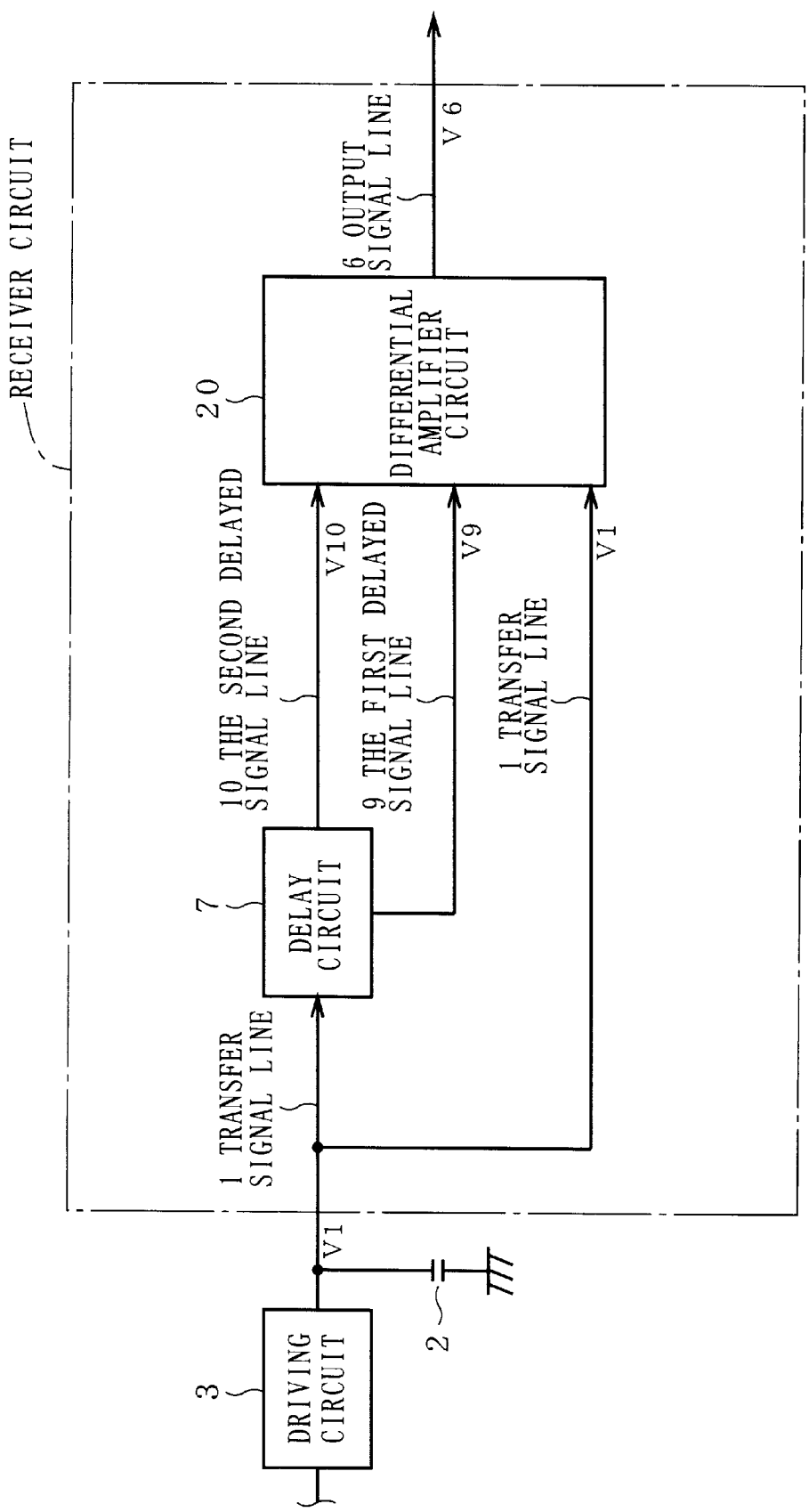
FIG. 1 is a block diagram showing a constitution of a semiconductor circuit device of the present invention.
Figure 4:
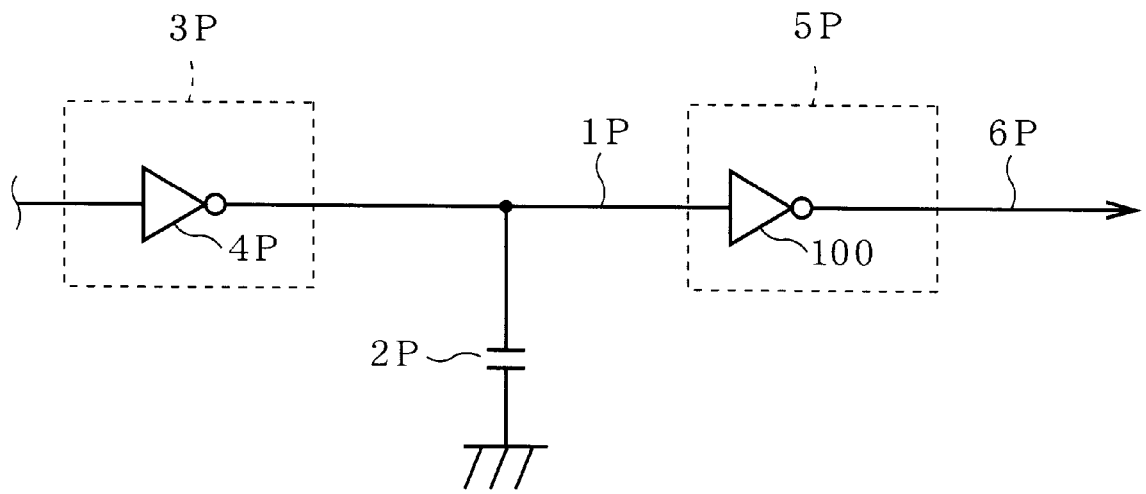
FIG. 4 is a circuit diagram showing a configuration of a semiconductor circuit device in the prior art.

FIG. 1 is a block diagram showing a constitution of a semiconductor circuit device of the present invention. The present device is roughly constituted of a driving circuit system and a receiver circuit 5. The driving circuit system consists of a driving circuit 3 for generating and outputting a transfer signal V1 (or a first signal) and a transfer signal line l(or a first signal line) for transferring the transfer signal V1 to the receiver circuit 5. The driving circuit 3 includes an inverter circuit and the transfer signal line 1 is a wire having capacitance 2 such as parasitic capacitance, like the device of FIG. 4.

On the other hand, the receiver circuit 5, as the heart of the present device, includes the transfer signal line 1 for transferring the received transfer signal V1 to a differential amplifier circuit 20 as described below, a path for delaying the transfer signal V1 by a predetermined time and transferring a delayed signals V10 and the like which are obtained by delaying the transfer signal V1 to the differential amplifier circuit 20, the differential amplifier circuit 20 receiving the transfer signal V1 and the delayed signals V10 and the like, and an output signal line 6 for outputting an output signal of the differential amplifier circuit 20 to the outside. The above-mentioned delay path includes a delay circuit 7 and the first and second delayed signal lines 9 and 10, as shown in FIG. 1. The delay circuit 7 delays the transfer signal V1 by the first delay time to output the first delayed signal V9 obtained by this delay to the first delayed signal line 9, and further delays the transfer signal V1 by the second delay time to output the second delayed signal V10 obtained by this delay to the second delayed signal line 10. In this case, the predetermined time is the second delay time (>the first delay time). Alternatively, the delay circuit 7 may delay the first delayed signal V9 by the second delay time to output a signal obtained by this delay as the second delayed signal V10. In this case, the predetermined time is a sum of the first delay time and the second delay time.

The differential amplifier circuit 20 receives the transfer signal V1 and the second delayed signal V10 and works as follow. Specifically, functions of the differential amplifier circuit 20 are: (a) to output an output signal of low power-supply potential when both the transfer signal V1 and the second delayed signal V10 are of low power-supply potential, and (b) to immediately change a level of the output signal from low power-supply potential to high power-supply potential when the transfer signal V1 of low power-supply potential rises by the first threshold voltage (<intermediate potential) which is predetermined as discussed later. Additional functions are: (c) to continue outputting an output signal of high power-supply potential when both the transfer signal V1 and the second delayed signal V10 are of high power-supply potential, and (d) to immediately change the level of the output signal from high power-supply potential to low power-supply potential when the transfer signal V1 of high power-supply potential falls by the second threshold voltage (<intermediate potential) which is predetermined as discussed later.

Furthermore, the differential amplifier circuit 20 may include a (first) current mirror differential amplifier circuit in which the first delayed signal line 9 serves as a terminal on the high potential (power-supply potential) side and a (second) current mirror differential amplifier circuit in which the first delayed signal line 9 serves as a terminal on the low potential (ground potential) side.

In each of the current mirror differential amplifier circuits of the differential amplifier circuit 20, the input signal V10 to be compared with the input signal V1 is behind the other input signal V1 and remains in "L" level when the input signal V1 changes from "L" level (low power-supply potential) to "H" level (high power-supply potential). Conversely, when the input signal V1 falls, the input signal V10 remains in "H" level. Therefore, the output signal V6 immediately changes in level in response to the rise or fall of the input signal V1 before the input signal V1 reaches a potential intermediate between "H" level and "L" level, and since no path for passing the DC current exists in the differential amplifier circuit 20 when the input signal V1 is in "H" level or "L" level, no DC current flows, resulting in lower power consumption in the differential amplifier circuit 20.

A specific configuration of the receiver circuit 5 of FIG. 1 will be discussed below as the first preferred embodiment.

(The First Preferred Embodiment)

Figure 2:
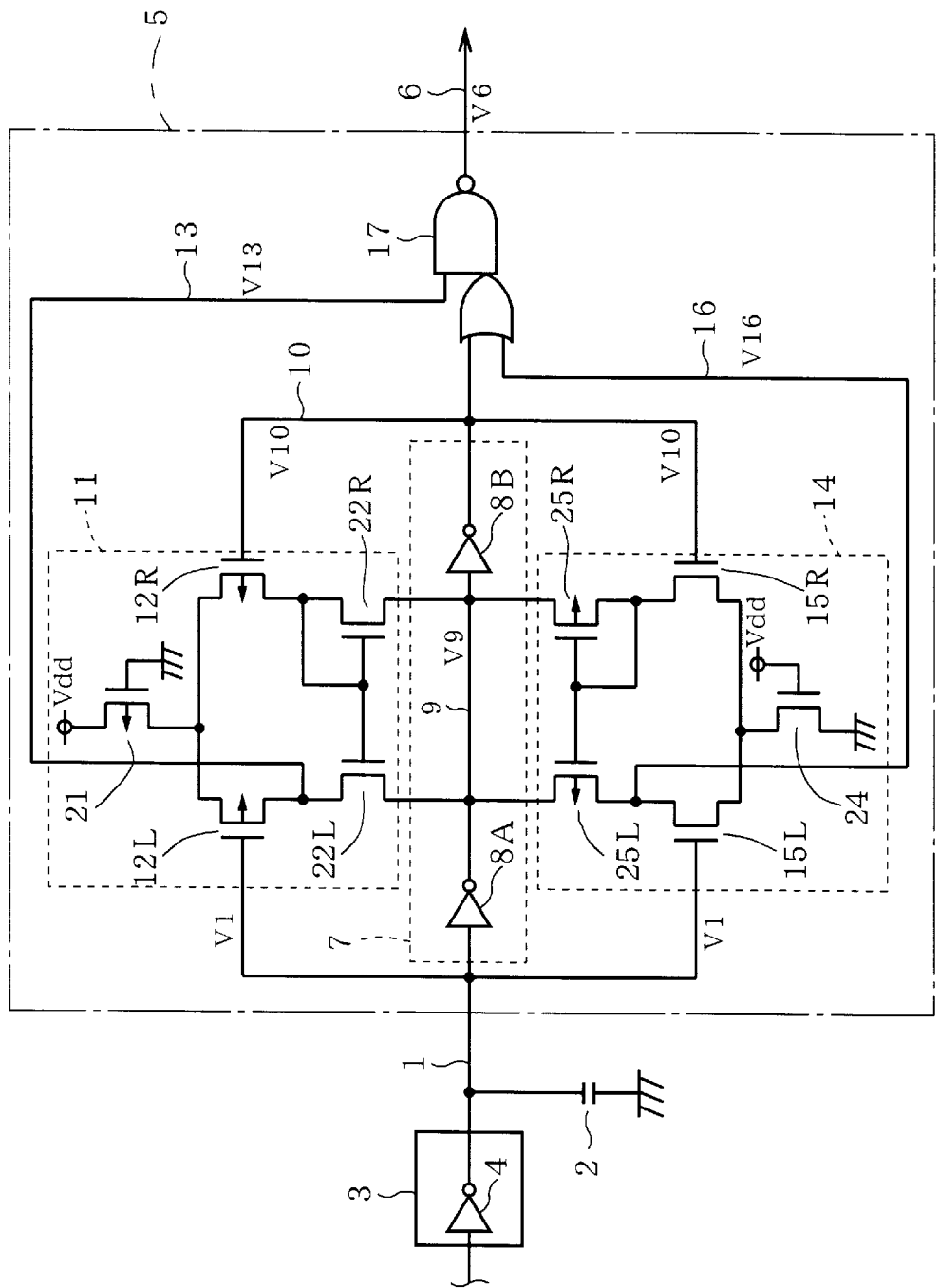
FIG. 2 shows a configuration of a semiconductor circuit device in accordance with a first preferred embodiment of the present invention.

FIG. 2 shows a configuration of the receiver circuit in accordance with the first preferred embodiment. Elements of FIG. 2 identical to those of FIG. 1 are represented by reference signs identical to those of FIG. 1.

FIG. 2 shows the transfer signal line 1 for transferring the transfer signal V1, the capacitance 2 applied to the transfer signal line 1, such as wiring parasitic capacitance between a potential of the transfer signal line 1 and the ground potential, the driving circuit 3 for generating and outputting the transfer signal V1, the inverter circuit 4 which is a constituent of the driving circuit 3, the receiver circuit 5 receiving the transfer signal V1 and the output signal line 6 for outputting the output signal V6 of the receiver circuit 5. The receiver circuit 5 includes the delay circuit 7 receiving the transfer signal V1, the first and second inverter circuits 8A and 8B constituting the delay circuit 7, the first delayed signal line 9 (a source signal line) for transferring the source signal V9 serving as the first delayed signal outputted from the first inverter circuit 8A and the second delayed signal line 10 (the second signal line) for transferring the second delayed signal V10 (the second signal) outputted from the second inverter circuit 8B. Further, the receiver circuit 5 includes the second current mirror differential amplifier circuit 11 (hereinafter also referred to as "the second differential amplifier circuit") receiving the transfer signal V1 and the second delayed signal V10 (hereinafter also referred to simply as "delayed signal V10"), whose ground terminal is connected to the source signal line 9, the first P-type MOS transistor 12L whose gate is connected to the transfer signal line 1 and the second P-type MOS transistor 12R whose gate is connected to the second delayed signal line 10, the third and fourth N-type MOS transistors 22L and 22R connected to the first and second P-type MOS transistors 12L and 12R, respectively, the fifth P-type MOS transistor 21 whose gate is connected to the ground end which is the low power-supply potential and whose source is connected to the high-potential power supply having a high power-supply potential Vdd, serving as a constant-current power supply and an output signal line 13 for outputting the second output signal V13 of the second differential amplifier circuit 11. Furthermore, the receiver circuit 5 includes the first current mirror differential amplifier circuit 14 (hereinafter also referred to as "the first differential amplifier circuit") receiving the transfer signal V1 and the second delayed signal V10, whose power-supply terminal is connected to the source signal line 9, the first N-type MOS transistor 15L whose gate is connected to the transfer signal line 1 and the second N-type MOS transistor 15R whose gate is connected to the second delayed signal line 10, the third and fourth P-type MOS transistors 25L and 25R connected to the first and second N-type MOS transistors 15L and 15R, respectively, the fifth N-type MOS transistor 24 whose gate is connected to the high-potential power supply having the high power-supply potential Vdd and whose source is connected to the low power-supply potential (ground) end, serving as a constant-current power supply and an output signal line 16 for outputting the first output signal V16 of the first differential amplifier circuit 14. Still further, the receiver circuit 5 includes an OR-NAND compound gate circuit 17 (logic circuit) receiving the delayed signal V10 (also referred to as "the third output signal") and the second and first output signals V13 and V16 for outputting the output signal V6.

Next, with reference to FIGS. 2 and 3A to 3F, an operation of the receiver circuit 5 of the first preferred embodiment will be discussed. FIGS. 3A to 3F are waveforms showing the operation of the signals in the receiver circuit 5 in accordance with the first preferred embodiment.

Figure 3:
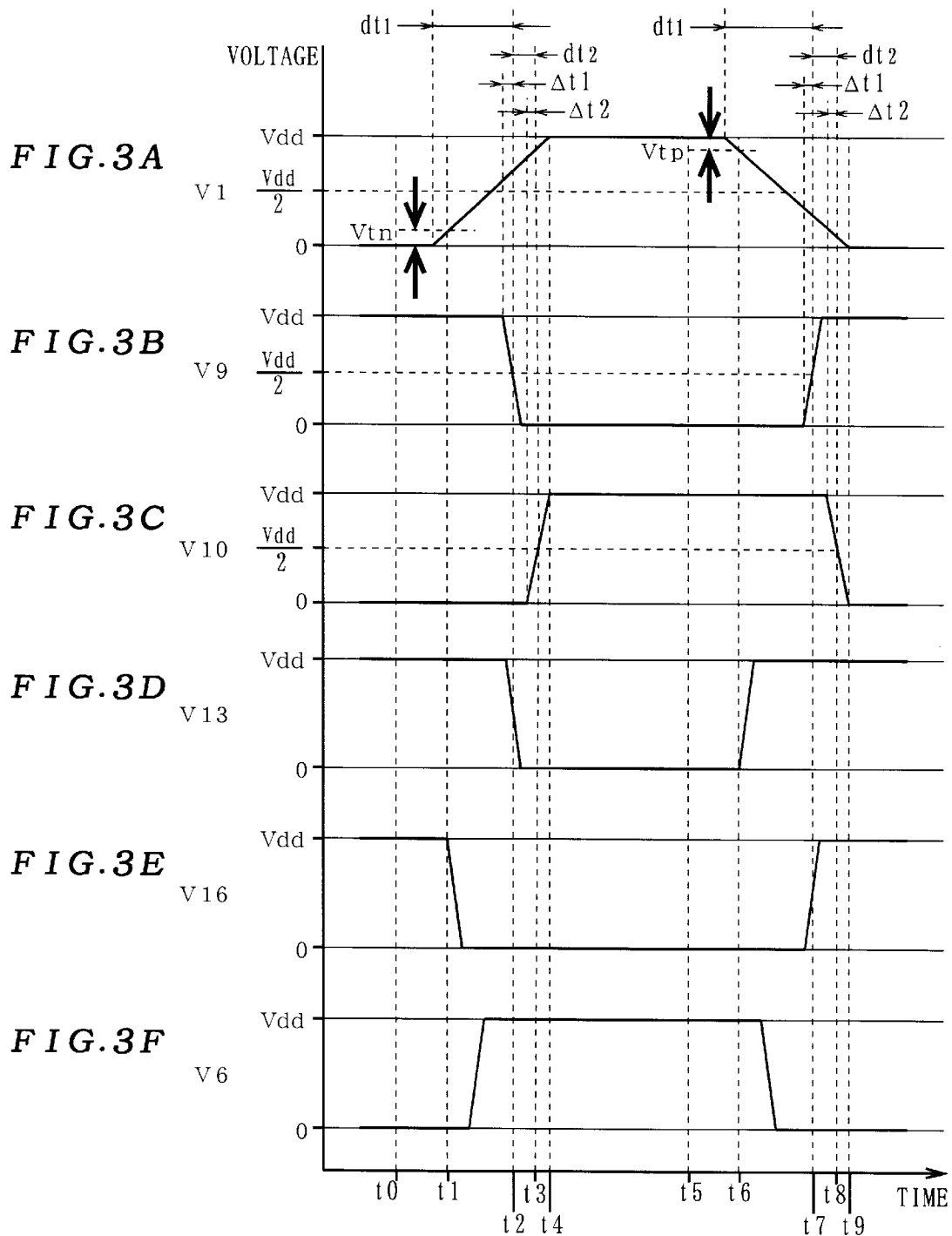
FIGS. 3A to 3F are waveforms showing an operation of the semiconductor circuit device in accordance with the first preferred embodiment of the present invention.

(i) First, at time t0 (in an initial state) of FIG. 3A, it is assumed that the transfer signal V1 is in "L" level. At this time, as shown in FIGS. 3B and 3C, the source signal V9 is in "H" level and the delayed signal V10 is in "L" level, and the first and second P-type MOS transistors 12L and 12R are in an on state. Since the source signal V9 is in "H" level, however, the second differential amplifier circuit 11 do not work, even if both the two input signals V1 and V10 are in "L" level, and therefore the output signal V13 from the second differential amplifier circuit 11 is in "H" level. On the other hand, the first and second N-type MOS transistors 15L and 15R in the circuit 14 are in an off state since both the transfer signal V1 and the delayed signal V10 to be inputted to the first differential amplifier circuit 14 are in "L" level and the first output signal V16 from the first differential amplifier circuit 14 is in "H" level since the source signal V9 is in "H" level. Therefore, the output signal V6 of the receiver circuit 5 is kept in "L" level as shown in FIG. 3F. In short, when both the input signal V1 and the delayed signal V10 are in "L" level, the output signal V6 is in "L" level. Additionally, since no path for passing a DC current, no DC current flows in the receiver circuit 5.

(ii) A case where the transfer signal V1 in an initial state changes from "L" level to "H" level will be studied.

As shown in FIG. 3A, when the level of the transfer signal V1 rises and reaches a threshold voltage Vtn (a first threshold voltage) of the first and second N-type MOS transistors 15L and 15R of the first differential amplifier circuit 14 at time t1, the first N-type MOS transistor 15L comes into an on state. Since the delayed signal V10 remains in "L" level (FIG. 3C), however, the second N-type MOS transistor 15R is kept in the off state. Therefore, only the first differential amplifier circuit 14 starts operation (at this time, the second differential amplifier circuit 11 do not operate yet) and the output signal V16 of the circuit 14 comes into "L" level as shown in FIG. 3E. In response to this level change, an output signal of the compound gate circuit 17, i.e., the output signal V6 of the receiver circuit 5 changes from "L" level to "H" level. The first threshold voltage Vtn is set less than half of the level Vdd (Vdd/2) of high-potential power supply in the receiver circuit 5.

Thus, on the rise of the transfer signal V1, only the first differential amplifier circuit 14 is used to raise the output signal V6 and the first differential amplifier circuit 14 starts operation at the time sufficiently before the transfer signal V1 reaches the potential Vdd/2 after the rise of the transfer signal V1, contributing to the rise of the output signal V6 into "H" level.

(iii) When the level of the transfer signal V1 further rises and reaches to the intermediate potential Vdd/2, the first inverter circuit 8A thereafter starts operation and the source signal V9 starts falling from "H" level to "L" level. After starting the fall, the level of the source signal V9 falls to the intermediate potential which is half of the power-supply potential Vdd at time t1 further behind the fall by a delay time Δ t1, as shown in FIGS. 3A and 3B. At this time, however, the delayed signal V10 remains in "L". The change in level of the source signal V9 to "L" level stops the operation of the first differential amplifier circuit 14, but the first output signal V16 of the circuit 14 is kept in "L" level since the first N-type MOS transistor 15L is in the on state.

On the other hand, the change in level of the source signal V9 to "L" level starts the operation of the second differential amplifier circuit 11. At this time, since the transfer signal V1 is higher in level than the delayed signal V10 of "L" level, the second output signal V13 from the circuit 11 changes in level from "H" level to "L" level at the time t2 as shown FIG. 3D. The output signal V6 of the receiver circuit 5 remains in "H" level, not changing, at this time.

Thus, the first inverter circuit 8A outputs the source signal V9 of the intermediate potential at the time t2 after the elapse of the first delay time dt1 from the time when the transfer signal V1 starts rising.

After the time t2, the second inverter circuit 8B starts operation, and the delayed signal V10 starts rising and reaches the intermediate potential at time t3 behind the rise by a delay time Δ t2. In other words, the second inverter circuit 8B outputs the delayed signal V10 of the intermediate potential at the time t3 after the elapse of a predetermined delay time which is a sum of the first and second delay times dt1 and dt2 from the time when the transfer signal V1 starts rising. At this time, the output signal V6 of the receiver circuit 5 remains in "H" level, not changing.

After that, the transfer signal V1 and the delayed signal V10 further rise and reach the high power-supply potential Vdd at time t4. In this case, if the delayed signal V10 reaches "H" level earlier than the transfer signal V1 does at time t4, the second differential amplifier circuit 11 is differentially inputted in a reverse direction and the second output signal V13 of the circuit 11 becomes "H" level. In order to avoid this situation, the predetermined delay time (dt1+dt2) is set so that the change in level of the delayed signal V10 to "H" level may be completed at the time t4 or later, when the change in level of the transfer signal V1 to "H" level is completed. This setting of the predetermined delay time is achieved by controlling the delay time dt1 and/or dt2 by the delay circuit 7. Specifically, though the delay circuit 7 consists of the first and second inverter circuits 8A and 8B in FIG. 2, the delay circuit 7 may have more inverters connected in series to one another, or resistors, capacitors and the like, to increase the delay time.

Thus, the differential amplifier circuit consisting of the first and second differential amplifier circuits 14 and 11 and the compound gate circuit 17 in the receiver circuit 5 outputs the output signal V6 of the power-supply potential Vdd when the transfer signal V1 is higher in level than the delayed signal V10.

(iv) The output signal V6 of the receiver circuit 5 remains in "H" level while the transfer signal V1 is kept in "H" level at time t5, as shown in FIG. 3A. Specifically, the differential amplifier circuit consisting of the first and second differential amplifier circuits 14 and 11 and the compound gate circuit 17 continues outputting the output signal V6 of "H" level when both the transfer signal V1 and the delayed signal V10 are in "H" level. In this stationary state, the first and second differential amplifier circuits 14 and 11 do not operate and no DC current flows in the receiver circuit 5.

(v) A case where the transfer signal V1 falls from "H" level to "L" level will be studied.

When the transfer signal V1 starts falling from a time point after the time t5 and reaches a voltage lower than the power-supply potential Vdd by the threshold voltage Vtp (the second threshold voltage) of the P-type MOS transistors 12L and 12R, the first P-type MOS transistor 12L comes into an on state (at this time, the second P-type MOS transistor 12R is in an off state since the delayed signal V10 is in "H" level) and only the second differential amplifier circuit 11 operates. The second output signal V13 of the second differential amplifier circuit 11 rises to "H" level from time t6 as shown in FIG. 3D, and in response to the level change, the output signal V6 of the receiver circuit 5 changes from "H" level to "L" level. At this time, the source signal V9 remains in "L" level and the first differential amplifier circuit 14 does not operate.

Thus, on the fall of the transfer signal V1, only the second differential amplifier circuit 11 is substantially used to fall the output signal V6 and therefore, the output signal V6 falls when the transfer signal V1 reaches a level (Vdd–Vtp) slightly lower than the power-supply potential Vdd.

(vi) When the transfer signal V1 further falls and reaches the intermediate potential Vdd/2, the first inverter circuit 8A threreafter starts operation and the source signal V9 thereby starts rising. In response to the level change of the source signal V9, the second differential amplifier circuit 11 stops operation, but the second output signal V13 from the circuit 11 remains in "H" level since the first P-type MOS transistor 12L is in the on state and the fifth P-type MOS transistor 21 is in an on state. Conversely, since the first differential amplifier circuit 14 starts operation and the transfer signal V1 is lower in potential than the delayed signal V10, the first output signal V16 starts changing from "L" level to "H" level after the source signal V9 starts rising as shown in FIG. 3E.

After that, the source signal V9 reaches the intermediate potential Vdd/2 at time t7. Specifically, the first inverter circuit 8A outputs the source signal V9 of the intermediate potential at the time t7 after the elapse of the first delay time dt1 from the fall of the transfer signal V1. Receiving the source signal V9, the second inverter circuit 8B starts operation at a time point after the time t7, and the delayed signal V10 starts falling from "H" level to "L" level. At this time, the output signal V16 from the first differential amplifier circuit 14 has the power-supply potential Vdd and the output signal V6 from the receiver circuit 5 remains in "L", not changing.

(vii) The transfer signal V1 further falls. Specifically, the second inverter circuit 8B outputs the delayed signal Vi() of the intermediate potential (Vdd/2) at the time t8 after the elapse of the predetermined delay time which is the sum of the first delay time dt1 and the second delay time dt2 from the fall of the transfer signal V1. At this time, the output signal V6 from the receiver circuit 5 remains in "L" level, not changing in level.

For the same reason as the level change of the transfer signal V1 from the "L" level to "H" level, the predetermined delay time (dt1+dL1) is set so that the fall of the delayed signal V10 in level may be completed at time t9 or later, when the transfer signal V1 reaches "L" level.

In the receiver circuit 5 of the first preferred embodiment or in the semiconductor circuit device having the receiver circuit 5 with such configuration as discussed above, since the delayed signal V10 is behind the transfer signal V1 by a predetermined time, the delayed signal V10 still has the low power-supply potential even if the transfer signal V1 rises in level by the first threshold voltage Vtn from the low power-supply potential. Therefore, the first differential amplifier circuit 14 receiving the transfer signal V1 and the delayed signal V10 can output the first output signal V16 which falls to "L" level when the transfer signal V1 reaches the first threshold voltage Vtn before the transfer signal V1 rises from the low power-supply potential to the intermediate potential Vdd/2, and the receiver circuit 5 can thereby output the output signal V6 of high power-supply potential at the time sufficiently before the transfer signal V1 reaches the intermediate potential Vdd/2.

Further, even when the transfer signal V1 falls in level by the second threshold voltage Vtp from the high power-supply potential Vdd, the delayed signal V10 still has the high power-supply potential. Therefore, the second differential amplifier circuit II receiving the transfer signal V1 and the delayed signal V10 can output the second output signal V13 which rises to "H" level when the transfer signal V1 reaches the potential lower than the high power-supply potential Vdd by the second threshold voltage Vtp before the transfer signal V1 falls from the high power-supply potential Vdd to the intermediate potential Vdd/2, and the receiver circuit 5 can thereby output the output signal V6 of low power-supply potential at the time sufficiently before the transfer signal V1 reaches the intermediate potential Vdd/2.

Thus, the first differential amplifier circuit 14 achieves the rise of the output signal V6 at high speed on the rise of the transfer signal V1 while the second differential amplifier circuit 11 achieves the fall of the output signal V6 at high speed on the fall of the transfer signal V1. Therefore, it is advantageously possible to provide a semiconductor circuit device for general purpose, which can be applied to various uses.

Further, no malfunction of the first and second differential amplifier circuits 14 and 11 occurs even if the transfer signal V1 and the delayed signal V10 have a noise smaller than the first or second threshold voltage Vtn or Vtp. Therefore, with the receiver circuit 5 of the first preferred embodiment, the present semiconductor circuit device achieves excellent noise immunity, along with a still faster operation, as compared with the prior-art semiconductor circuit device.

Furthermore, in the receiver circuit 5 of the first preferred embodiment or in the semiconductor circuit device having the receiver circuit 5, since the first and second differential amplifier circuits 14 and 11 output their output signals in fast response to the level changes, i.e., rise and fall, of the transfer signal V1, there is no necessity to increase a driving power of the driving circuit 3 as compared with that of the conventional driving circuit and therefore the prior-art driving circuit can be used without any improvement. It is moreover possible to lower a driving power of the driving circuit 3 as compared with that of the prior-art driving circuit. In this point, the semiconductor circuit device having the receiver circuit 5 of the first preferred embodiment can achieve lower power consumption than the prior-art semiconductor circuit device.

Additionally, as discussed above, since no DC current flows in the first and second differential amplifier circuits 14 and 11 when both the transfer signal V1 and the delayed signal V10 are in a stationary state, also in this point, the semiconductor circuit device of the first preferred embodiment can achieve still lower power consumption than the prior-art semiconductor circuit device.

While the invention has been shown and described in detail, the foregoing description is in all aspects illustrative and not restrictive. It is therefore understood that numerous modifications and variations can be devised without departing from the scope of the invention.

I claim:

1. A semiconductor circuit device, comprising:
   a driving circuit generating a first signal;
   a first signal line transferring said first signal;
   a delay circuit connected to said first signal line, said delay circuit delaying said first signal by a predetermined time to output a second signal;
   a second signal line transferring said second signal; and
   a differential amplifier circuit connected to said first and second signal lines as input signal lines;
   wherein said predetermined time is longer than a time needed for a level change of said first signal from a low power-supply potential to a higher potential by a first threshold voltage;
   said first threshold voltage is lower than an intermediate potential between said low power-supply potential and a high power-supply potential;
   said differential amplifier circuit outputs an output signal of said low power-supply potential when both said first and second signals are of said low power-supply potential;
   said differential amplifier circuit changes a level of said output signal from said low power-supply potential to said high power-supply potential when said first signal rises from said low power-supply potential by said first threshold voltage to reach said higher potential; and said differential amplifier circuit continues outputting said output signal of said high power-supply potential when both said first and second signals are of said high power-supply potential.

2. The semiconductor circuit device of claim 1, wherein said predetermined time is longer than a time needed for a level change of said first signal from said high power-supply potential to a lower potential by a second threshold voltage;

said second threshold voltage is lower than said intermediate potential; and said differential amplifier circuit changes said level of said output signal from said high power-supply potential to said low power-supply potential when said first signal falls from said high power-supply potential by said second threshold voltage.

3. The semiconductor circuit device of claim 1, wherein a level change of said second signal is completed when said level change of said first signal is completed or later.

4. The semiconductor circuit device of claim 1, wherein said differential amplifier circuit produces no DC current when both said first and second signals are of said high power-supply potential or said low power-supply potential.

5. The semiconductor circuit device of claim 4, wherein said delay circuit comprises;

a first delay circuit delaying said first signal by a first delay time to output a first delayed signal; and a second delay circuit delaying said first delayed signal by a second delay time to output a second delayed signal;

said predetermined time is a sum of said first delay time and said second delay time;

said differential amplifier circuit comprises;

a first current mirror differential amplifier circuit, which receives said first signal and said second delayed signal, having a low-potential terminal which is connected to a low-potential power supply of said low power-supply potential and a high-potential terminal which receives said first delayed signal; and a second current mirror differential amplifier circuit, which receives said first signal and said second delayed signal, having a high-potential terminal which is connected to a high-potential power supply of said high power-supply potential and a low-potential terminal which receives said first delayed signal;

said differential amplifier circuit outputs said output signal which rises from said low power-supply potential to said high power-supply potential in response to a level change of an output signal from said first current mirror differential amplifier circuit; and said differential amplifier circuit outputs said output signal which falls from said high power-supply potential to said low power-supply potential in response to a level change of an output signal from said second current mirror differential amplifier circuit.

6. The semiconductor circuit device of claim 5, wherein said delay circuit comprises a plurality of inverter circuits connected in series to one another.

7. A receiver circuit, comprising:

a first signal line transferring a first signal;

a delay circuit connected to said first signal line, said delay circuit delaying said first signal to output a delayed signal; and a differential amplifier circuit having input terminals respectively receiving a said first signal transferred through an interconnection and said delayed signal of said transfer signal from said delay circuit;

wherein said delayed signal comprises;

a first delayed signal produced by delaying said transfer signal by a first delay time; and a second delayed signal produced by delaying said transfer signal by a second delay time larger than said first delay time.

8. The receiver circuit of claim 7, wherein said differential amplifier circuit comprises;

a first current mirror differential amplifier circuit having a low-potential terminal which is connected to a low-potential power supply and a high-potential terminal which receives said first delayed signal, said first current mirror differential circuit receiving said transfer signal and said second delayed signal; and a second current mirror differential amplifier circuit having a high-potential terminal which is connected to a high-potential power supply and a low-potential terminal which receives said first delayed signal, said second current mirror differential amplifier circuit receiving said transfer signal and said second delayed signal;

said differential amplifier circuit outputs said output signal which rises from a low power-supply potential to a high power-supply potential in response to a level change of an output signal from said first current mirror differential amplifier circuit; and said differential amplifier circuit outputs said output signal which falls from said high power-supply potential to said low power-supply potential in response to a level change of an output signal from said second current mirror differential amplifier circuit.

9. A receiver circuit, comprising:

a delay circuit having an input terminal receiving a first signal and a first output terminal outputting a delayed signal of said first signal as a second signal; and a differential amplifier circuit connected to said input terminal and said first output terminal;

said differential amplifier circuit comprising a second output terminal;

said second output terminal outputting an output signal of low power-supply potential when both said first and second signals are of said low power-supply potential;

said second output terminal outputting an output signal of high power-supply potential when both said first and second signals are of said high power-supply potential;

said second output terminal outputting an output signal of said high power-supply potential when said first signal is higher in potential than said second signal; and said second output terminal outputting an output signal of said low power-supply potential when said first signal is lower in potential than said second signal.

* * * * *